United States Patent [19]
Hashimoto

[11] Patent Number: 6,096,577
[45] Date of Patent: Aug. 1, 2000

[54] METHOD OF MAKING SEMICONDUCTOR DEVICE, AND FILM CARRIER TAPE

[75] Inventor: Nobuaki Hashimoto, Suwa, Japan

[73] Assignee: Seiko Epson Corporation, Tokyo, Japan

[21] Appl. No.: 09/180,896

[22] PCT Filed: Mar. 18, 1998

[86] PCT No.: PCT/JP98/01154

§ 371 Date: Jan. 15, 1999

§ 102(e) Date: Jan. 15, 1999

[87] PCT Pub. No.: WO98/43290

PCT Pub. Date: Oct. 1, 1998

[30] Foreign Application Priority Data

Mar. 21, 1997 [JP] Japan .................................. 9-087444

[51] Int. Cl.⁷ ........................... H01L 21/44; H01L 21/48; H01L 21/50
[52] U.S. Cl. ........................................... 438/116; 438/975
[58] Field of Search ..................... 438/116, 975

[56] References Cited

U.S. PATENT DOCUMENTS 4,832,255  5/1989  Bickford .................. 228/254

FOREIGN PATENT DOCUMENTS 6-252205  9/1994  Japan .
6-252216  9/1994  Japan .
WO 95/08856  3/1995  WIPO .

*Primary Examiner*—Charles Bowers
*Assistant Examiner*—Nema Berezny
*Attorney, Agent, or Firm*—Oliff & Berridge, PLC

[57] ABSTRACT

The present invention provides a method of making CSP type semiconductor devices by the use of an general-purpose gang bonding type bonder while improving the yield. The method includes the steps of forming an imitation film carrier tape (20), disposing the imitation film carrier tape (20) relative to a semiconductor chip (12) so that an imitation junction (26a) and an electrode (13) face in a direction of opposing each other, positioning the imitation junctions (26a) with the electrode (13) while being observed through an aperture (22), removing the imitation film carrier tape (20) from the semiconductor chip and disposing a film carrier tape (30) at the same position as occupied by the imitation film carrier tape (20).

11 Claims, 4 Drawing Sheets

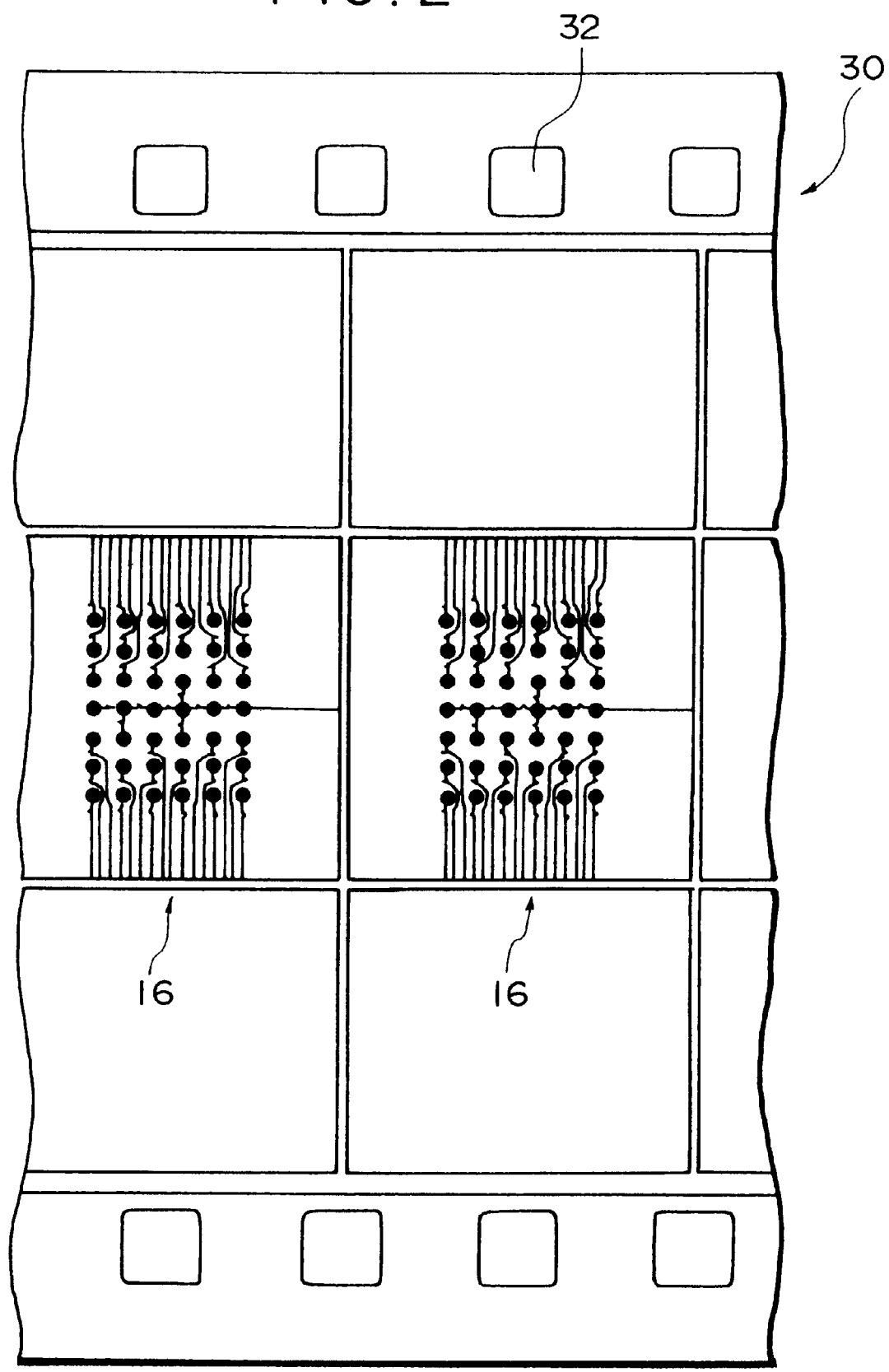

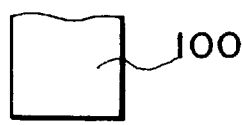
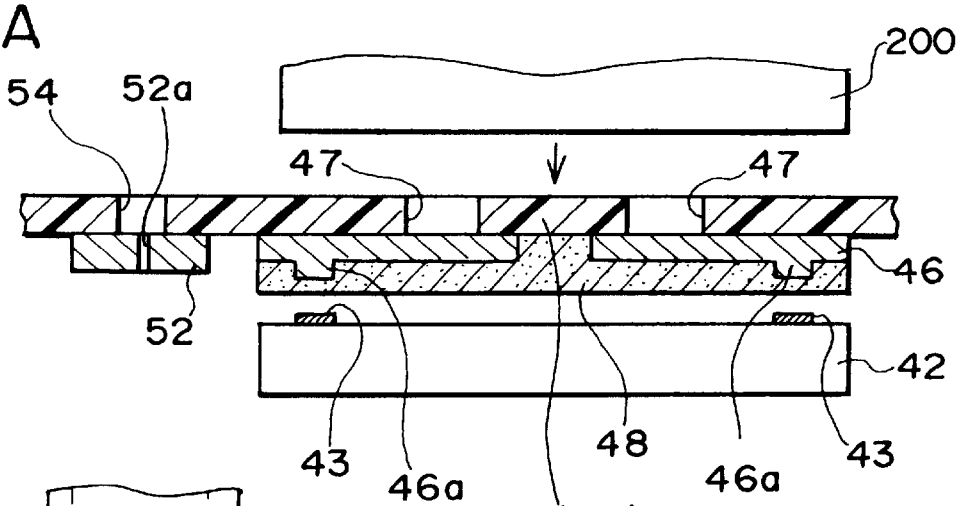
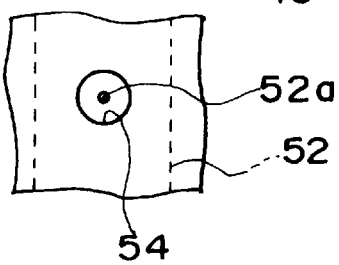

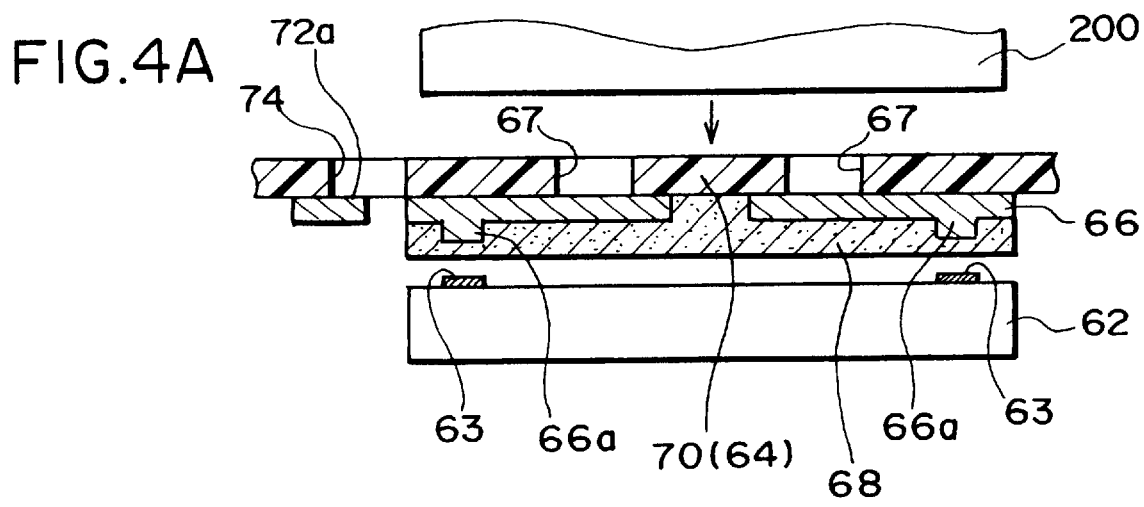
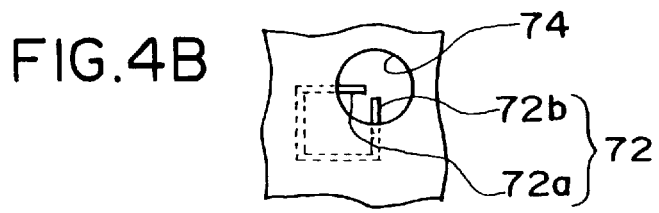

METHOD OF MAKING SEMICONDUCTOR DEVICE, AND FILM CARRIER TAPE

TECHNICAL FIELD

The present invention relates to a method of making a CSP (chip scale/size package) type semiconductor device and also concerns a film carrier tape,

BACKGROUND ART

Following the high density mounting of semiconductor devices, it has been found that bare chips are ideal. However, it is difficult to assure the quality of bare chips and to handle the bare chips. Thus, CSP (chip scale/size package) has been developed. Although CSP is not formally defined now, it is generally understood as the IC package of which package size is equal to or slightly larger than those of the IC chips. The development of the CSP technology is important to advance the high density mounting. An example of the prior arts relating to the CSP is described in International Patent Publication WO 95/08856. This publication describes a method in which a lead frame is layered on a lead frame support (exclusive jig). A special tool is then used to cut individual leads with the cut lead parts being downwardly bent and connected to the bonding pad of the corresponding IC chip. Such a method requires any special jig or equipment and also raises a problem in that the yield is poor since the lead tends to be undesirably bent wren the lead parts are to be bonded to the IC chip while cutting the lead.

To overcome such a problem, it has been proposed that a wiring pattern is formed on an insulating film and located opposing to the active face of a semiconductor chip, with part of the wiring pattern being directly bonded to the electrodes of the semiconductor chip. This can overcome the above-mentioned problem as such, but cannot properly perform the positioning procedure while viewing from above, since the wiring pattern is located opposing to the electrodes. To provide the proper positioning of the wiring pattern, there is required a flip chip bonding device which can observe the wiring pattern and electrodes located opposing to one another through an optical system. This will further raise a new problem in that the general-purpose gang bonding type bonder cannot be used.

The present invention was made in view of the fact that the positional recognition could not be attained only by the unidirectional recognition means according to the conventional art since the present invention was of a structure (which did not have any device hole) different from that of the conventional substrates. Therefore, an object of the present invention is to provide a method of making a semiconductor device which can properly be positioned while viewing through recognition means from a single direction (or from the side of an insulating film). In other words, the proper positioning can be accomplished by using the unidirectional recognition means of the conventional art without need of any complicated structure on the side of the making system. The present invention also provides a film carrier tape usable in such a method.

DISCLOSURE OF THE INVENTION

The present invention provides a method of making a semiconductor device, comprising:

a step of providing an imitation film, the imitation film having an imitation pattern and a light transmission portion, the imitation pattern having an imitation junction identical to a junction of a wiring pattern to an electrode of a semiconductor chip, the wiring pattern formed on an insulating film, the imitation pattern having a shape identical to a shape of the wiring pattern, the light transmission portion formed in an area corresponding to the imitation junction;

a step of disposing the imitation film and the semiconductor chip such that the imitation junction and the electrode face in a direction of opposing each other;

a step of positioning the imitation junction and the electrode while being observed through the light transmission portion;

a step of removing the imitation film and disposing the insulating film at a same position as occupied by the imitation film; and a step of bonding the junction and the electrode.

According to the present invention, the positioning between the electrodes of the semiconductor chip and the imitation junctions of the imitation patterns is first performed using the imitation film. Since the imitation film is formed with the light transmission portions at positions corresponding to the imitation junctions, the imitation junctions can easily be positioned with the respective electrodes while being observed through the light transmission portions. Thus, the imitation film will be disposed relative to the semiconductor chip such that the imitation junctions are properly located corresponding to the respective electrodes. Subsequently, the imitation film is removed and the insulating film is disposed at the same position as occupied by the imitation film. Since the insulating film has the same wiring patterns as the imitation patterns and also the same junctions as the imitation junctions, the junctions will be disposed at the positions corresponding to the respective electrodes when the imitation film is located at to the same position. After the junctions have been bonded to the respective electrodes, any subsequent step will be executed to complete the semiconductor device, if necessary.

According to the present invention, the insulating film can be positioned only by changing it to the imitation film. Therefore, the bonding of the junctions to the respective electrodes can accurately be performed even if the junctions cannot be viewed.

In the present invention, the step of providing the imitation film is intended to acquire the imitation film prior to positioning, but may include a step itself of previously forming an imitation film.

In the present invention, each of the light transmission portion may be an aperture. Since the light transmission portion is an aperture, the insulating film may be formed of any suitable material. For example, even a substrate made of a low light-transmission material can be used.

Furthermore, the entire imitation film may be made of a light transmission material. In this case, the light transmission portion may be provided by causing the imitation film itself to transmit the light.

The present invention also provides a method of making a semiconductor device, comprising:

a step of forming on an insulating film a wiring pattern having a junction to an electrode of a semiconductor chip and at least one positioning mark;

a step of storing relative positions of the positioning mark and the junction;

a step of disposing the insulating film and the semiconductor chip such that the junction and the electrode face in a direction of opposing each other;

a step of detecting a position of the positioning mark to calculate a position of the junction;

a step of positioning the junction and the electrode based on information relating to the calculated position of the junction; and bonding the junction and the electrode.

According to the present invention, the position of the junction can be calculated when the positioning mark is detected, since the relative position between the positioning mark formed on the insulating film and the junction for bonding to electrode of the semiconductor element has been stored. Based on the calculated positioning information of the junctions, the junctions can be positioned and bonded with the electrodes.

The present invention further provides a method of making a semiconductor device, comprising the steps of:

a step of forming a positioning mark on the insulating film; and a step of storing relative positions of the positioning mark and the junction, wherein after the step of removing the imitation film and disposing the insulating film at a same position as occupied by the imitation film, a position of the positioning mark is detected to calculate a position of the junction, the junction and the electrode is positioned based on information relating to the calculated position of the junction, and then the junction and the electrode are bonded.

In short, the present invention is a method of finely adjusting the insulating film through the positioning marks after the imitation film has been used to perform the positioning of the insulating film. Such a method can more improve the accuracy in position.

The positioning mark may be a pore etched in a metal foil formed on a face on which the wiring pattern is formed, the pore being recognizable through an aperture formed in the insulating film from a face reverse to the face on which the wiring pattern is formed.

Since the pores functioning as positioning marks are formed by etching the metal foil formed on the same face as the wiring pattern, the pores can be formed simultaneously with formation of the wiring pattern. By using the etching technique, thus, the highly accurate positioning can be obtained.

The positioning mark may have at least one linear configuration on a face on which the wiring pattern is formed and may be recognizable through an aperture formed in the insulating film from a face reverse to the face on which the wiring pattern is formed.

In such a case, it is preferable that a plurality of the positioning marks are formed to be orthogonal to one another.

By forming a plurality of positioning marks orthogonal to one another, the coordinates of the positioning marks can easily be specified since the respective positioning marks are orthogonal to X-axis and Y-axis in the plane coordinates.

The present invention further provides a film carrier tape comprising:

a wiring pattern having a junction to an electrode of a semiconductor chip; and at least one positioning mark, the positioning mark being a pore etched in a metal foil formed on a face on which the wiring pattern is formed, the pore being recognizable through an aperture from a face reverse to the face on which the wiring pattern is formed.

This film carrier tape may be used to make a semiconductor device according to the aforementioned method of the present invention.

The positioning mark may have at least one linear configuration on a face on which the wiring pattern is formed and may be recognizable through an aperture from a face reverse to the face on which the wiring pattern is formed.

Furthermore, a plurality of the positioning marks may be formed to be orthogonal to one another.

BRIEF DESCRIPTION OF THE DRAWINGS

FIG. 2 is a view showing a film carrier tape.

FIGS. 3A and 3B are view illustrating a method of making a semiconductor device according to the second embodiment of the present invention.

FIGS. 4A and 4B are view illustrating a method of making a semiconductor device according to the third embodiment of the present invention.

BEST MODES FOR CARRYING OUT THE INVENTION

Some preferred embodiment of the present invention will now be described with reference to the drawings.

(First Embodiment)

Figure 1A:
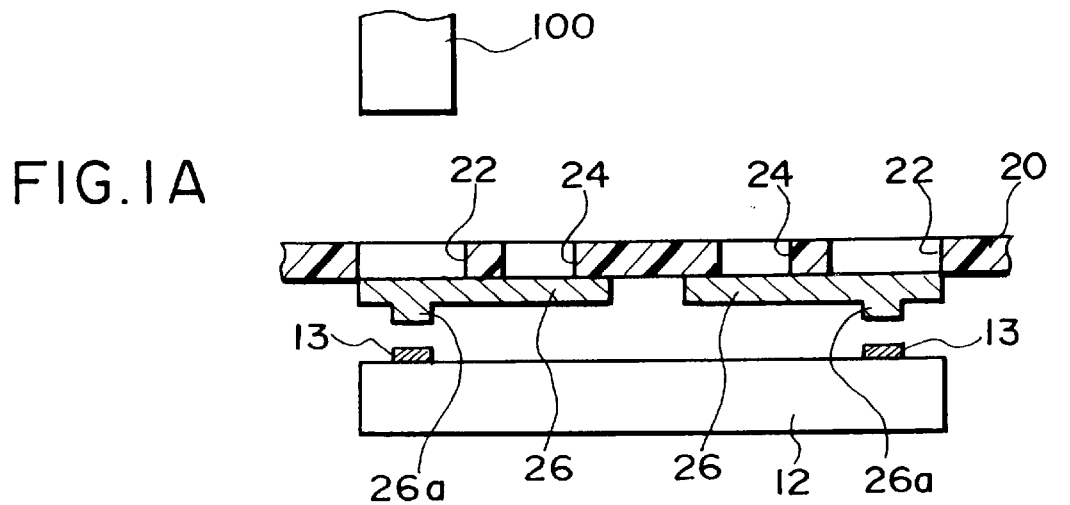
FIGS. 1A to 1C are view illustrating a method of making a semiconductor device according to the first embodiment of the present invention.
Figure 1B:
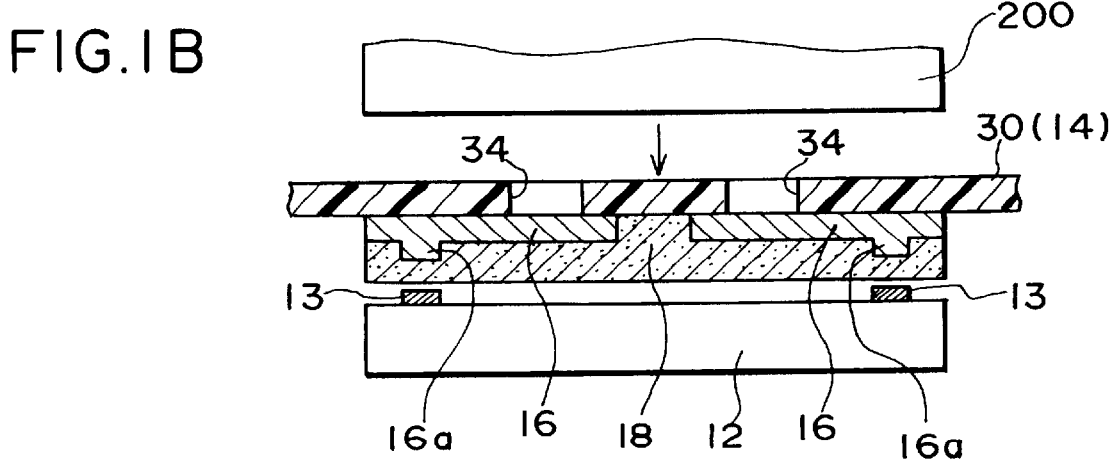
Figure 1C:
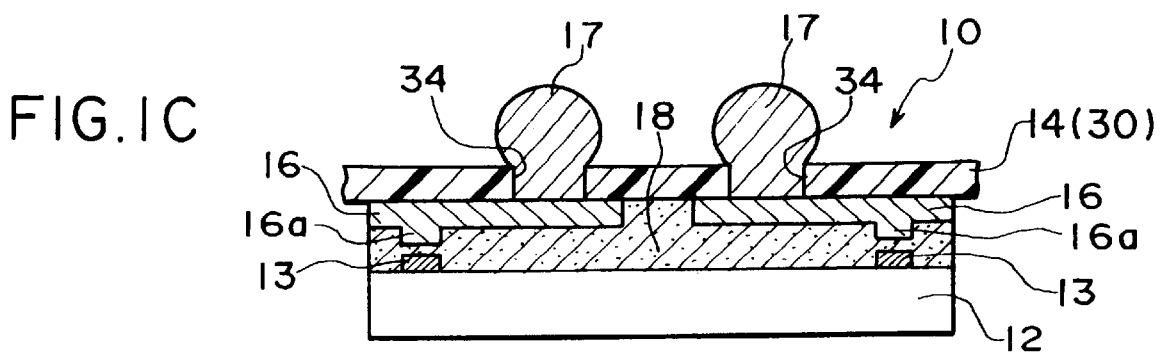

FIGS. 1A to 1C are views illustrating a method of making a semiconductor device according to the first embodiment of the present invention. Referring to FIG. 1C, a finished semiconductor device 10 includes a semiconductor chip 12 and a film piece 14. Wiring patterns 16 are formed on one side of the film piece 14. Each of the wiring patterns 16 includes convex junctions 16a formed therein. Each of the junctions 16a is bonded to the respective one of the electrodes 13 on the semiconductor chip 12 through an anisotropic conductive film 18. The configuration of the junctions 16a may be flat rather than convex. Each of the wiring patterns 16 also includes an external terminal 17 formed thereon.

The present embodiment utilizes an general-purpose gang bonding type bonder to make the semiconductor device 10.

As shown in FIG. 1A, first the semiconductor chip 12 is positioned with the electrodes 13 thereof being directed upwardly. An imitation film carrier tape 20 is then placed over the semiconductor chip 12. The imitation film carrier tape 20 is formed from a film carrier tape 30 for forming a film piece 14 in the semiconductor device 10 (see FIG. 1B).

The film carrier tape 30 is an insulating tape used for the well-known TAB (tape automated bonding) technique. FIG. 2 shows such a film carrier tare 30 which includes sprocket holes 32 and a plurality of wiring patterns 16 continuously formed thereon. FIG. 2 shows the side of the film carrier tape 30 as viewed from the side of the wiring patterns 16.

The imitation film carrier tape 20 is formed by further processing the film carrier tape 30 shown in FIG. 2. More particularly, the imitation film carrier tape 20 has imitation patterns 26 at one side, each of which has an imitation convex junction 26a. The imitation film carrier tape 20 also includes light transmission apertures 22 formed therethrough at areas corresponding to the imitation junctions 26a. Thus, through the apertures 22, the imitation junctions 26a can be observed from the side of the imitation film carrier tape reverse to on 20 which the imitation pattern 26 is formed. The imitation film carrier tape 20 also includes apertures 24 which are only apertures 34 left formed in the film carrier tape 30 and will not be used in the present invention.

More particularly, the imitation film carrier tape 20 is so disposed that the imitation patterns 26 are oriented to face the respective electrodes 13. At this time, the imitation junctions 26a are properly positioned directly above the respective electrodes 13 while being observed through the apertures 22.

The positioning of the imitation junctions 26a with the electrodes 13 is performed which being observed through a camera 100 located above the working area. Such a camera 100 is included in the general-purpose bonder.

When the imitation film carrier tape 20 is positioned in place, it is then removed and replaced by the actually used film carrier tape 30 that is located at exactly the same position as that of the imitation film carrier tape 20.

The film carrier tape 30 includes wiring patterns 16 formed thereon at one side, each of which has a convex junction 16a formed thereon. The junctions 16a are used to bond with the respective electrodes 13 in the semiconductor chip 12. The film carrier tape 30 includes apertures 34 each formed therethrough at an area corresponding to part of the wiring pattern 16. These apertures 34 are used to form external terminals 17 shown in FIG. 1C.

An anisotropic conductive film 18 is also applied to the film carrier tape 30. The anisotropic conductive film 18 is of a sheet over which metallic particles in the resin are dispersed.

Since the film carrier tape 30 is disposed at exactly the same position as the imitation film carrier tape 20, the junctions 16a can be positioned directly above the electrodes 13 without need of any re-positioning.

As shown in FIG. 1B, the film carrier tape 30 is then urged toward the semiconductor chip 12 by means of a bonding tool 200.

It is preferable that after one positioning has first been performed for a semiconductor device as one unit and the following positionings have been made for the second or subsequent semiconductor devices if necessary, the step shown in FIG. 1B is executed continuously.

In the step of FIG. 1B, thus, the anisotropic conductive film 18 is squeezed with the metallic particles between the electrodes 13 and the junctions 16a to provide an electrical conduction therebetween. If the anisotropic conductive film 18 is used, the electrical conduction will be provided only in the direction of squeezing the metallic particles and will not be provided in the other directions. Therefore, the adjacent junctions 16a will not be electrically conductive to each other even if the anisotropic conductive film 18 is applied over the whole junctions 16a.

When the junctions 16a have been bonded with the electrodes 13, ball-like solder parts are formed on the wiring patterns 16 through the apertures 34 to form external terminals 17, as shown in FIG. 1C. The film carrier tape 30 is then stamped out along the outline of the semiconductor chip 12 to provide the semiconductor device 10 having the film piece 14. Since the film carrier tape 30 is insulative, the film piece 14 is also insulative.

According to the present embodiment, thus, the junctions 16a can easily and simply be positioned and bonded with the electrodes 13 using the general-purpose bonder.

Although the present embodiment has been described as to the imitation film carrier tape 20 formed by processing the film carrier tape 30, a separately formed film carrier tape may be used. In such a case, the light transmission apertures for observing the junctions may be replaced by transparent parts. Alternatively, the imitation film carrier tape itself may be made of a transparent material so that the entire imitation film carrier tape will transmit light. Furthermore, the film piece 14 may initially be used together with an imitation film piece having the same size as that of the film piece 14 and the same function as that of the aforementioned imitation film carrier tape 20, in place of the film carrier tape 30 and imitation film carrier tape 20.

The present embodiment may utilize any of various well-known techniques for bonding between the junctions and the electrodes, other than the B-TAB type procedure.
(Second Embodiment)

FIGS. 3A and 3B show a method of making a semiconductor device according to the second embodiment of the present invention. The second embodiment produces a semiconductor device including a semiconductor chip 42 and a film piece 44, as in the semiconductor device 10 of FIG. 1C. The film piece 44 is formed by stamping out a film carrier tape 50 including wiring patterns 46 formed thereon. Each of the wiring patterns 46 is formed with a convex junction 46a which is bonded with the corresponding electrode 43 of the semiconductor chip 42 through an anisotropic conductive film 48. Each of the wiring patterns 46 is subsequently formed with an external terminal as in the external terminals 17 of FIG. 1C. For such a purpose, apertures 47 are formed in the film piece 44 therethrough.

In the present embodiment, the film carrier tape 50 includes pores 52a exposed as positioning marks. More particularly, a metal foil 52 is formed in the film carrier tape 50 on the same face as the wiring patterns 46 are formed and then dry etched to form pores 52a. FIG. 3B is a plan view showing one of such pores 52a. The film carrier tape 50 also includes an aperture 54 within which one pore 52a is positioned. Thus, the pore 52a can be viewed from the side of the film carrier tape 50 reverse to the side on which wiring pattern 46 is formed.

In the present embodiment, the junctions 46a of the wiring patterns 46 are bonded with the electrodes 43 of the semiconductor chip 42 as follows:

First, the positional relationship of the pores 52a relative to the junctions 46a is previously stored in a storage means. Since the pores 52a are dry etched, they can be formed at their accurate positions. Thus, the pores 52a are formed at their proper positions required by the design. The designed relative position between the pores 52a and the junctions 46a will directly provide the actually relative position therebetween.

The electrodes 43 of the semiconductor chip 42 are upwardly directed. The film carrier tape 50 is located opposing to the electrode 43, and disposed with the wiring patterns 46 thereof being downwardly directed. The camera 100 then detects the positions of the pores 52a by filming and development. The detected positional information of the pores 52a is used to calculate the positions of the junctions 46a. More particularly, the positions of the junctions 46a are calculated from the positional information of the pore 52a based on the previously stored positional relationship of the pores 52a relative to the junctions 46a.

The film carrier tape 50 is then moved relative to the semiconductor chip 42 so that the junctions 46a will be located directly above the respective electrodes 43.

Thus, the junctions 46a are positioned and bonded with the electrodes 43 through the bonding tool 200.

As described, the present embodiment can bond the junctions 46a with the electrodes 43 using the general-purpose bonder. It is preferable in the present embodiment that at least two pores 52a are formed as positioning marks. Thus, the two-dimensional positional relationship of the pores 52a relative to the junctions 46a can accurately be grasped.

The present embodiment may also utilize any of various well-known techniques for bonding between the junctions and the electrodes, other than the B-TAB type procedure.

(Third Embodiment)

FIGS. 4A and 4B are views illustrating a method of making a semiconductor device according to the third embodiment of the present invention. In the present embodiment, a semiconductor device including a semiconductor chip 62 and a film piece 64 is produced as in the semiconductor device 10 of FIG. 1C. The film piece 64 is formed by stamping out a film carrier tape 70 including wiring patterns 66 formed thereon. Each of the wiring patterns 66 is formed with a convex junction 66a which is in turn bonded with the corresponding one of electrodes 63 in the semiconductor chip 62 through an anisotropic conductive film 68. Each of the wiring patterns 66 is subsequently formed with an external terminal as in the external terminals 17 of FIG. 1C. For such a purpose, apertures 67 are formed in the film piece 64 therethrough.

In the present embodiment, the film carrier tape 70 is formed with positioning patterns 72a and 72b. More particularly, a metal foil 72 is formed on the film carrier tape 70 at the same face thereof as the wiring patterns 76 are formed and normally simultaneously etched to form the positioning patterns 72a and 72b. FIG. 4B is a plan view of the positioning patterns 72a and 72b. As shown in FIG. 4B, each of the positioning patterns 72a and 72b is of a linear configuration. These linear positioning patterns 72a and 72b are formed to be orthogonal to each other. The film carrier tape 70 includes an aperture 74 in which the tips of the positioning patterns 72a and 72b are disposed. Thus, the positioning patterns 72a and 72b can be viewed through the aperture 74 from the side of the film carrier tape 70 reverse to the wiring patterns 66.

As described, the positioning pattern 72a is formed to be orthogonal to the other positioning pattern 72b. Thus, when the respective positioning patterns 72a and 72b are disposed on the film carrier tape 70 so that each positioning pattern is orthogonal to X-axis or Y-axis in plane coordinates, the plane coordinates can be specified using only at least one of the positioning patterns 72a and 72b.

As in the second embodiment, the third embodiment also uses the camera 100 which detects the positions of the positioning patterns 72a and 72b by filming and development. The detected information with the previously stored positional relationship of the junctions 66a relative to the electrodes 63 are used to align and bond the junctions 66a and electrodes 63 with one another through the bonding tool 200.

The present embodiment can also bond the junctions 66a with the electrodes 63 by the use of the general-purpose bonder, as in the previously described embodiments.

Although the embodiments of the present invention have been described as to the semiconductor device, the present invention may similarly be applied to any other electronic parts, without depending on active or passive parts, so far as they are of surface mounting type that requires a number of external terminals as in the semiconductor device. Such electronic parts include resistors, capacitors, coils, oscillators, filters, temperature sensors, thermistors, varistors, volumes and fuses.

The present embodiment may also utilize any of various well-known techniques for bonding between the junctions and the electrodes, other than the B-TAB type procedure.

What is claimed is:

1. A method of making a semiconductor device, comprising:

a step of providing an imitation film, the imitation film having an imitation pattern and a light transmission portion, the imitation pattern having an imitation junction identical to a junction of a wiring pattern to an electrode of a semiconductor chip, the wiring pattern formed on an insulating film, the imitate-on pattern having a shape identical to a shape of the wiring pattern, the light transmission portion formed in an area corresponding to the imitation junction;

a step of disposing the imitation film and the semiconductor chip such that the imitation junction and the electrode face in a direction of opposing each other;

a step of positioning the imitation junction and the electrode while being observed through the light transmission portion;

a step of removing the imitation film and disposing the insulating film at a same position as occupied by the imitation film; and a step of bonding the junction and the electrode.

2. The method of making a semiconductor device according to claim 1, wherein the light transmission portion is an aperture.

3. The method of making a semiconductor device according to claim 1, wherein the imitation film is wholly made of light transmission material.

4. A method of making a semiconductor device, comprising:

a step of forming on an insulating film a wiring pattern having a junction to an electrode of a semiconductor chip and at least one positioning mark;

a step of storing relative positions of the positioning mark and the junction;

a step of disposing the insulating film and the semiconductor chip such that the junction and the electrode face in a direction of opposing each other;

a step of detecting a position of the positioning mark to calculate a position of the junction;

a step of positioning the junction and the electrode based on information relating to the calculated position of the junction; and bonding the junction and the electrode.

5. The method of making a semiconductor device according to claim 1, further comprising:

a step of forming a positioning mark on the insulating film; and a step of storing relative positions of the positioning mark and the junction, wherein after the step of removing the imitation film and disposing the insulating film at a same position as occupied by the imitation film, a position of the positioning mark is detected to calculate a position of the junction, the junction and the electrode is positioned based on information relating to the calculated position of the junction, and then the junction and the electrode are bonded.

6. The method of making a semiconductor device according to claim 4, wherein the positioning mark is a pore etched in a metal foil formed on a face on which the wiring pattern is formed, the pore being recognizable through an aperture formed in the insulating film from a face reverse to the face on which the wiring pattern is formed.

7. The method of making a semiconductor device according to claim 4, wherein the positioning mark has at least one linear configuration on a face on which the wiring pattern is formed and is recognizable through an aperture formed in the insulating film from a face reverse to the face on which the wiring pattern is formed.

8. The method of making a semiconductor device according to claim 7, wherein a plurality of the positioning marks are formed to be orthogonal to one another.

9. A film carrier tape comprising:

a wiring pattern having a junction to an electrode of a semiconductor chip; and at least one positioning mark, the positioning mark being a pore etched in a metal foil formed on a face on which, the wiring pattern is formed, the pore being recognizable through an aperture from a face reverse to the face on which the wiring pattern is formed.

10. The film carrier tape according to claim 9, wherein a plurality of the positioning marks are formed to be orthogonal to one another.

11. A film carrier tape comprising:

a wiring pattern having a junction to an electrode of a semiconductor chip; and at least one positioning mark, the positioning mark having at least one linear configuration on a face on which the wiring pattern is formed, the positioning mark being recognizable through an aperture from a face reverse to the face on which the wiring pattern is formed.

* * * * *